US010331803B2

(12) United States Patent
Wessman et al.

(10) Patent No.: US 10,331,803 B2
(45) Date of Patent: Jun. 25, 2019

(54) COMPUTER AIDED MODELING

(71) Applicant: Tekla Corporation, Espoo (FI)

(72) Inventors: Ragnar Wessman, Espoo (FI); Marko Aho, Helsinki (FI)

(73) Assignee: Tekla Corporation, Espoo (FI)

(*) Notice: Subject to any disclaimer, the term of this patent is extended or adjusted under 35 U.S.C. 154(b) by 1068 days.

(21) Appl. No.: 14/139,065

(22) Filed: Dec. 23, 2013

(65) Prior Publication Data

US 2014/0188438 A1 Jul. 3, 2014

(30) Foreign Application Priority Data

Jan. 2, 2013 (FI) .................................... 20135001

(51) Int. Cl.
*G06F 17/50* (2006.01)

(52) U.S. Cl.
CPC .......... *G06F 17/50* (2013.01); *G06F 17/5004* (2013.01)

(58) Field of Classification Search
CPC ............................. G06F 17/50; G06F 17/5004
USPC ............................................................. 703/1
See application file for complete search history.

(56) References Cited

U.S. PATENT DOCUMENTS

| | | | | |
|---|---|---|---|---|
| 4,475,104 A | * | 10/1984 | Shen | G09G 5/36 345/422 |
| 5,113,490 A | * | 5/1992 | Winget | G06T 17/20 345/419 |
| 5,561,747 A | | 10/1996 | Crocker et al. | |
| 5,905,501 A | * | 5/1999 | Kato | G06T 15/00 345/419 |

FOREIGN PATENT DOCUMENTS

EP 0361787 A2 4/1990

OTHER PUBLICATIONS

Principles of Interactive Computer Grahics, William M. Newman and Robert F. Sproull, McGraw-Hill Publishing Co., Second Ed., 1979, Chapt. 24, "Hidden Surface Elimination".*
Finnish Search Report for Patent Application No. 20135001 dated Aug. 27, 2013, 2 pages.
Arruda M. et al. Boolean Operations on Non-Manifold and B-Rep Solids for Mesh Generation Proceedings of the XXVII Iberian Latin American Congress on Computational Methods in Engineering, Sep. 3-6, 2006 [Retrieved Aug. 15, 2013], URL: http://www.tecgraf.puc-rio.br/-lfm/papers/ArrudaCILAMCE2006.pdf section "3.2 Description of the algorithm"; Figure 2; Table 1.
Crocker G A. et al. An editable nonmanifold boundary representation , IEEE Computer Graphics and Applications, No. 2, vol. 11, pp. 39-51, (Mar. 1, 1991) section "An alternative: merge and select" on pp. 42-43; Figure 3.

(Continued)

Primary Examiner — Saif A Alhija
(74) Attorney, Agent, or Firm — Kilpatrick Townsend & Stockton LLP

(57) ABSTRACT

In order to visualize or calculate a volume or an area of a structure modeled by using object types that overlap, topological items of boundary representations of the objects are provided with information on whether a topological item is indicated as clipped or not clipped; and topological items indicated as not clipped are used and topological items indicated as clipped are ignored when a model for the structure is visualized or used for volume or area calculations.

14 Claims, 7 Drawing Sheets

(56) References Cited

OTHER PUBLICATIONS

André Maues Brabo Pereira et al., "Boolean operations on multi-region solids for mesh generation" Engineering with Computers, Jul. 2012, vol. 28, Issue 3, pp. 225-239, DOI 10.1007/s00366-011-0228-8.

* cited by examiner

```
void        setopfinish (a, b, res, op)                401
Solid       *a, *b, **res;
int         op:
{
            int      i, j, inda, indb;

inda = (op == INTERSECT)   ?   nfca  :   0;
            indb = (op == UNION)       ?    0   :   nfcb;
            *res = (Solid *) new(SOLID, NIL);
            for(i=0; i<nfca; i++)
            {
                        sonfa[nfaca+i] = lmfkrh(sonfa[i]->floops->nextl, ++maxf;
                        sonfb[nfacb+i] = lmfkrh(sonfb[i]->floops->nextl, ++maxf;
            }
            if(op == DIFFERENCE)
                        revert(b);
            for (i=0; i<nfaca; i++
            {
                    if(DoClipping)
            4-1     {
                            movefac(sonfa[i+inda], *res, 0);
                    }
                    else {
                            movefac(sonfa[i+inda], *res, 0)
                            movefac(sonfb[i+indb], *res, 0)
                    }
            }
            cleanup(*res);
                    if(DoClipping)
                    {
            4-2     sonfa[i+inda]->floops->type = LOOP_CLIPPED;
                    }
                    else {
                            for(int i=0; i < nfaca; i++)
                            {
                            lkfmrh(sonfa[i+inda], sonfb[i+indb]);
                            loopglue(sonfa[i+inda]);
                            }
                    }
}
```

*FIG.4*

COMPUTER AIDED MODELING

RELATED APPLICATION

This application claims priority to FI application no. 20135001 filed Jan. 2, 2013, which is assigned to the applicant of the present application and is hereby incorporated by reference in its entirety for all purposes.

FIELD

The present invention relates to computer-aided modeling.

BACKGROUND ART

The development of data processing systems, computers and computer applications has transformed different processes into computerized processes. One example of such a process is modeling. Modeling means that a model is created from a product under design for describing the product to be constructed, the model containing at least information needed to illustrate the product. A product may be composed of one or more articles. Computer applications typically apply predefined object types that are provided with values in connection with the modeling to create objects (models) of articles that exist or will exist (or at least are planned to exist) in the real world. Examples of these object types in the field of building modeling include beams, columns, plates and slabs. A product model may in principle comprise an unlimited number of objects.

Typically a product comprises real world articles that may be in touch with each other or have no contact. Real world articles may not overlap with each other. A corresponding model may comprise for a real world article one or more objects that may overlap with each other or be in touch with each other as well as have no contact. Especially, if an article has a complicated shape, it is common to model the article by using basic object types. Examples of such basic object types include a cube, a rectangle, a ball and a parallelogram. Even not so complicated shapes are easier to model by using basic object types that overlap as is obvious from FIG. 2A illustrating a single article (structure) and FIG. 2B showing basic objects used for forming the single article.

For illustrating the article or calculating filling volumes, like the amount of concrete needed to obtain a corresponding cast-in-situ structure (article), the basic objects are merged. One possibility to merge the objects is to use Boolean operations (union, intersection and difference), for example as described in "Boolean operations on multi-region solids for mesh generation" by André Maués Brabo Pereira, Marcos Chataignier de Arruda, Antônio Carlos de O. Miranda, William Wagner M. Lira, Luiz Fernando Martha, Engineering with Computers, July 2012, Volume 28, Issue 3, pp 225-239, DOI 10.1007/s00366-011-0228-8. The result of the merging by using Boolean operations is a single object formed by a real union of the merged objects. However, especially for complex models, forming the required real union is a rather complicated mechanism that uses quite a lot of computing capacity.

SUMMARY

An object of the present invention is thus to provide a simplified mechanism to provide information that is sufficient for illustration and volume and/or area calculation purposes. The object of the invention is achieved by a method, an apparatus, and a computer program product which are characterized by what is stated in the independent claim. Preferred embodiments of the invention are disclosed in the dependent claims.

BRIEF DESCRIPTION OF THE DRAWINGS

In the following, different embodiments will be described in greater detail with reference to the attached drawings, in which

FIG. 4 shows an exemplary pseudo code;

DETAILED DESCRIPTION OF SOME EMBODIMENTS

The following embodiments are exemplary. Although the specification may refer to "an", "one", or "some" embodiment(s) in several locations, this does not necessarily mean that each such reference is to the same embodiment(s), or that the feature only applies to a single embodiment. Single features of different embodiments may also be combined to provide other embodiments.

The present invention is applicable to any computer-aided modeling system, and corresponding modeling applications (i.e. modeling programs) including entity-based modeling systems and outline-based modeling systems that support boundary representation. The boundary representation, often abbreviated as B-rep or BREP, is a method for representing shapes by using limits. A solid is represented as a collection of connected surface elements. Boundary representation models are composed of two parts: topology and geometry (surfaces, curves and points). The main topological items are: faces, edges, and vertices. A face is a bounded portion of a surface; an edge is a bounded piece of a curve, and a vertex lies at a point. In entity-based modeling systems, physical properties of an article to be modeled are expressed as attributes, i.e. by using parameters. In other words, an object is given its creation point or points, such as a starting point and ending point of the object, the number of creation points depending on the article to be modeled by the object, and values for different parameters representing the physical values of the article. This way the object is not tied to the physical properties of the article it depicts, but the geometry of the object can be created, when needed, by using the parameters. For example, a beam may be modeled in an entity-based modeling system by defining its starting point and ending point and providing values for different parameters representing the physical properties of the beam. The parameters of a beam, for example, may include location, material, type of cross-section, and size. The parameters may even indicate the type of the object, which in the beam example is a beam. In outline-based modeling systems an object consists of edges, and the form and size of the article are essential elements of the object. In an outline-based modeling system a beam, for example, is modeled by drawing each side of the beam and then combining the sides to form the beam, the profile of the beam being then modified by moving a necessary number of beam sides away from their original location.

Figure 1:
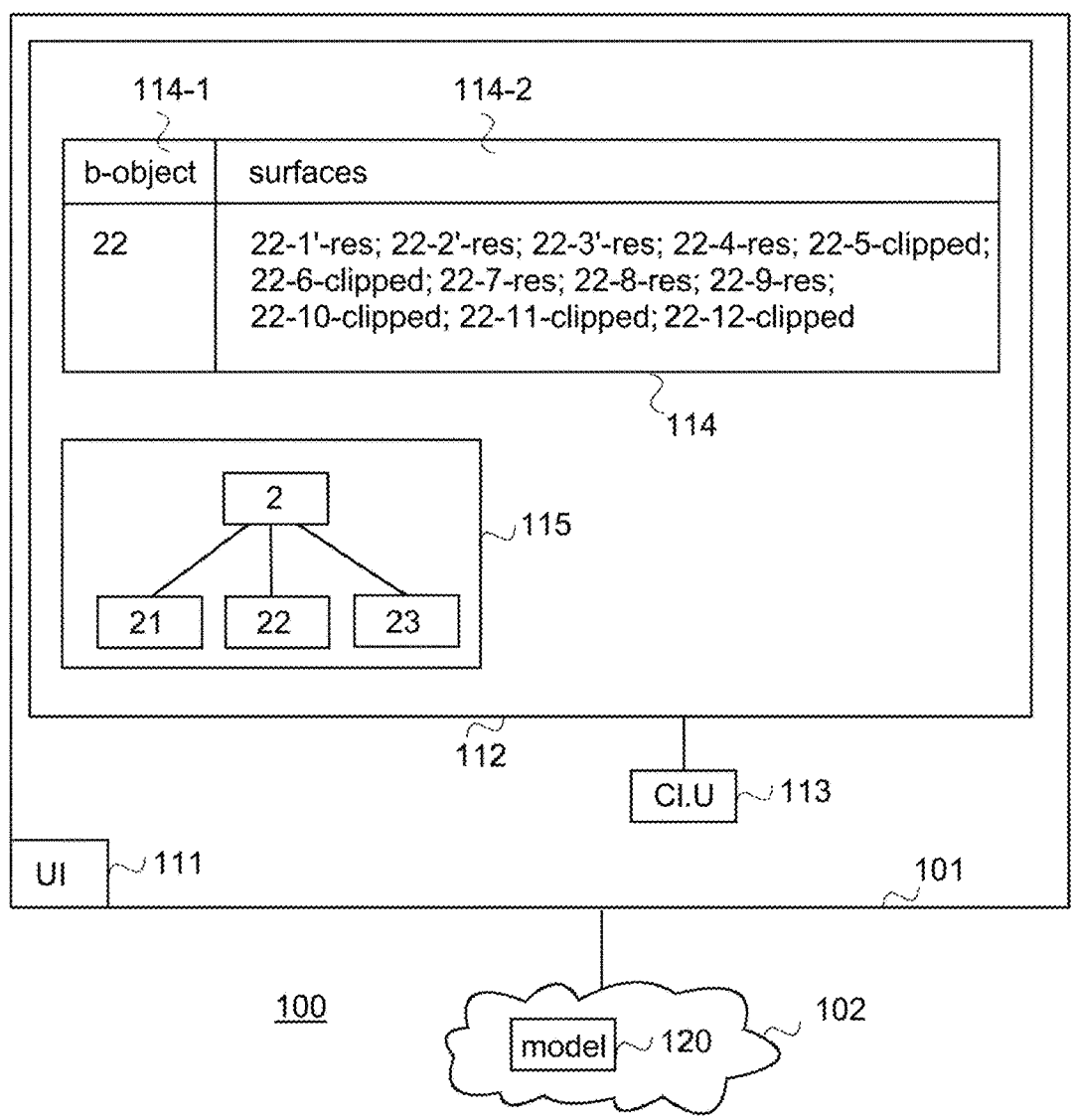
FIG. 1 shows a simplified architecture of an exemplary system having schematic block diagrams of exemplary apparatuses.

FIG. 1 illustrates a simplified modeling system 100 comprising one or more apparatuses 101 (only one shown in FIG. 1) connected to a data storage 102 storing a model 120. It is obvious to a person skilled in the art that the system may also comprise other functions and structures that need not be described in greater detail here and that the data storage may be an integral part of the apparatus. Further, details of the disclosed structures and apparatuses that are not disclosed below are irrelevant to the invention, and therefore they are not described in detail here.

The apparatus 101 is a computing device comprising not only prior art means, but also means for implementing a functionality described with an embodiment/example and it may comprise separate means for each separate function, or means may be configured to perform two or more functions, and even to combine functions of different embodiments/examples. These means may be implemented by various techniques. For example, the means may be implemented in hardware (one or more apparatuses), firmware (one or more apparatuses), or software (one or more modules) components (recorded indelibly on a medium such as read-only-memory or embodied in hard-wired computer circuitry), or combinations thereof. For a firmware or software, implementation can be through units/modules (e.g. procedures, functions, and so on) that perform the functions described herein. The apparatus may generally include a processor (not shown in FIG. 1), a controller, a control unit, a microcontroller or the like connected to a memory and to various interfaces of the apparatus. Generally, the processor is a central processing unit, but the processor may be an additional operation processor.

For implementing one or more of the functionalities described below, the apparatus 101 illustrated in FIG. 1 comprises a user interface 111, one or more memories 112 (only one shown in FIG. 1) and a clipping unit 113 (CI.U). It should be appreciated that the implementation of the operative connections between the units may deviate from what is presented in FIG. 1. The computing apparatus 101 may be any apparatus with which the model may be created and/or downloaded and/or edited and/or viewed and/or accessed and/or stored to the data storage 102, or otherwise handled/processed. Examples of apparatuses include a server, like a cloud server or a grid server, and a user terminal or a work station, such as a laptop, a smartphone, a personal computer, a tablet computer, a field device, an e-reading device, a printer with processing capabilities or a personal digital assistant (PDA).

The user interface 111 is an interface for the user, i.e. the person processing the model, to the modeling system. The user can create a model, modify a model, study it, output desired drawings and reports of the model, view the drawings, input information to the model, etc. by the means of the user interface 111.

The apparatus may generally include one or more volatile and/or non-volatile memories 112 that may be configured to store a working version (a working copy) of a model or part of the model the user has selected to process, for example as a "run-time database". Typically, data of the model are read from the data storage, and during processing the data constitute a "run-time database" in a central memory, for example, of the computing apparatus, where the data can be processed faster. When the processing ends, the run-time data or part of the run time data in the memory may be stored in the data storage.

In the illustrated example the "run-time database", i.e. the memory 112 comprises a Boolean associations record 114 associating a basic object 114-1 that has undergone a clipping operation with clipping result information 114-2, the clipping operation and the clipping result information being described in more detail below in connection with FIGS. 3 to 5, using FIGS. 2A to 2E as examples. Depending on an implementation, the clipping result may be cached (temporarily stored) for a certain period and at most as long as the run-time database is maintained, or stored permanently as part of the model in the run-time database and read therefrom or be deleted after another structure is selected. An advantage provided by the use of a cache is that it increases performance by saving calculation resources and providing a faster output.

Figure 2A:
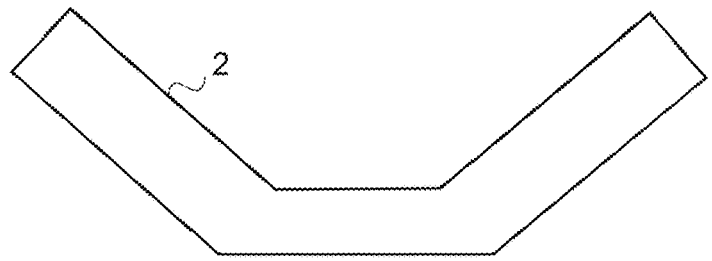
FIG. 2A illustrates a top view of an exemplary model of an article as shown to a user.

Further, in the illustrated example the "run-time database" 112 also contains hierarchy tree information 115, which in the illustrated example describes the hierarchy of an article (structure) illustrated in FIG. 2A with the basic objects it comprises. For example, in a cast concrete structure 2, parts 21, 22 and 23 form the whole cast concrete structure 2. The hierarchy tree may be described as a data structure in which children (i.e. lower level hierarchy nodes) form a parent, and in which a parent may also be a child for a higher level hierarchy node. An alternative to the hierarchy tree is a list. It should be appreciated that the hierarchy tree (or the list or any other data structure) is an optional feature; the invention may be implemented without such a tree (or list or any other data structure). Further, if such a hierarchy tree or list is used, it may be created each time when the model is read in, or on need-basis (like when an object belonging to a structure is selected), or it may be stored persistently as a part of the model.

The term "object" used herein means an object representing (modeling) an article that will or may exist in the real world or at least is planned to exist in the real world, and the term "basic object" means a separate object used by a modeler to create a more complex object comprising at least two basic objects. Typically, but not necessarily, the basic object has a geometric fundamental (basic) form, like a circle, a triangle, a square, a rectangle, a parallelogram, a cube, a ball, a hemisphere, a cylinder, a cone, a prism, a parallelepiped and a pyramid. However, the basic object may be any arbitrarily shaped solid boundary representation object. Further, it should be appreciated that the term "article" used herein means anything that will or may exist in the real world or at least is planned to exist in the real world and that may be modeled by a modeling application, covering one or more single pieces/articles, one or more parts, one or more assemblies including sub-assemblies, and one or more structures.

The one or more memories 112 may also store other data, like a computer program code, such as software applications (for example, for the clipping unit 113) or operating systems, information, data, content, or the like for the processor to perform steps associated with operation of the apparatus in accordance with embodiments. A memory may be a random access memory, a read only memory, firmware, programmable logic, a double floating-gate field effect transistor, a hard drive, or another fixed data memory or storage device, etc., and typically store content, data, or the like. Further, the memory, or part of it, may be a removable memory detachably connected to the apparatus, or a cloud-based memory attachable to the apparatus via a communication connection.

The apparatus 101 comprises the clipping unit 113 for performing one or more functionalities from different embodiments described below. The clipping unit 113 may be a separate unit or integrated to another unit in the apparatus. In another embodiment of the invention, the clipping unit 113 may be divided into separate units, for example, one unit for performing original clipping and one unit for updating clipping in response to a change. The clipping unit 113 may be configured as a computer or a processor, or a microprocessor, such as a single-chip computer element, or as a chipset, including at least a memory for providing a storage area used for arithmetic operation, and an operation processor for executing the arithmetic operation. The clipping unit 113 may comprise one or more computer processors, application-specific integrated circuits (ASIC), digital signal processors (DSP), digital signal processing devices (DSPD), programmable logic devices (PLD), field-programmable gate arrays (FPGA), and/or other hardware components that have been programmed in such a way to carry out one or more functions of one or more embodiments. An embodiment provides a computer program embodied on any client-readable distribution/data storage medium or memory unit (s) or article(s) of manufacture, comprising program instructions executable by one or more processors/computers, which instructions, when loaded into an apparatus, constitute the clipping unit 113. Programs, also called program products, including software routines, program snippets constituting "program libraries", applets and macros, can be stored in any medium, and may be downloaded into an apparatus. The data storage medium or the memory unit may be implemented within the processor/computer or external to the processor/computer, in which case it can be communicatively coupled to the processor/computer via various means as is known in the art. In other words, the clipping unit 113 may be an element that comprises one or more arithmetic logic units, a number of special registers and control circuits.

Further, the apparatus 101 may comprise other units used in or for modeling and for other purposes, such as an outputting unit (not illustrated in FIG. 1) for providing different outputs, like material lists or drawings, one or more receiving units and/or transmitting units (including a transmitter and/or a receiver or a corresponding means for receiving and/or transmitting information) so that a model may be retrieved and/or stored, and/or other user data, content, control information, signaling and/or messages can be received and/or transmitted. However, they are irrelevant to the actual invention and, therefore, they need not be discussed in more detail here.

Although the apparatus has been depicted as one unity, different units and memory may be implemented in one or more physical or logical units.

In the illustrated example, the modeling system comprises the apparatus as a terminal/client, and the data storage 102 is a separate data repository or database comprising data 120 relating to a model. The data repository may be any kind of conventional or future data repository, including distributed and centralized storing of data, managed by any suitable management system. An example of distributed storing includes a cloud-based storage in a cloud environment (which may be a public cloud, a community cloud, a private cloud, or a hybrid cloud, for example). The implementation of the data repository and the way how the data is stored, retrieved and updated bear no significance to the invention and need not be described in detail here. Further, as said above, in the simplest case the data 120 relating to the model is stored in the apparatus.

FIG. 2A illustrates an upper side of a single structure 2 modeled by using three basic objects. The view of FIG. 2A is the one continuously shown to the modeler, and should a real union of the objects be formed, the structure formed by internal processes of the apparatus for processing would also be such.

Figure 2B:
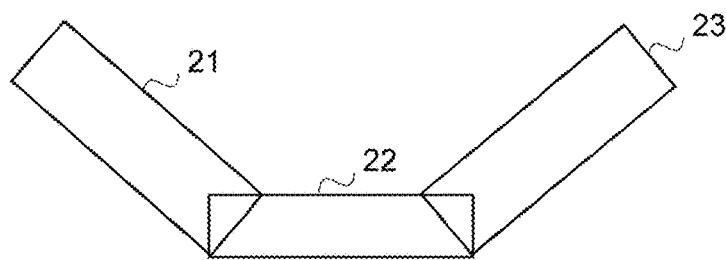
FIG. 2B illustrates a top view of basic objects used to create the exemplary model of FIG. 2A.
Figure 2C:
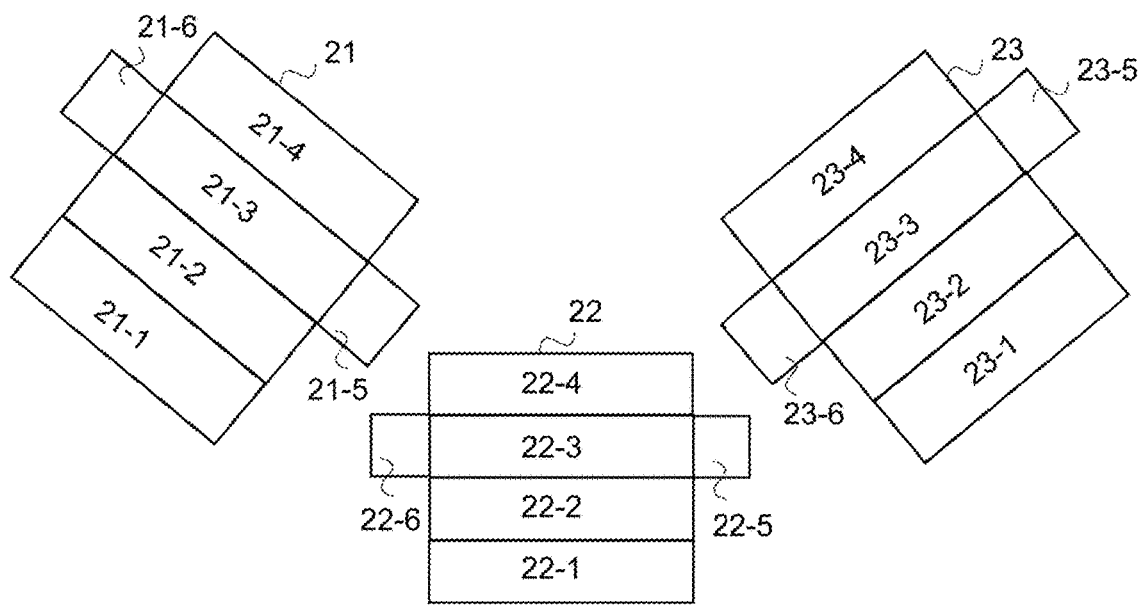
FIGS. 2C, 2D, and 2E are cut-out views of basic objects belonging to the exemplary article in different phases of creation of a pseudo union for the exemplary model of FIG. 2A.
Figure 2F:
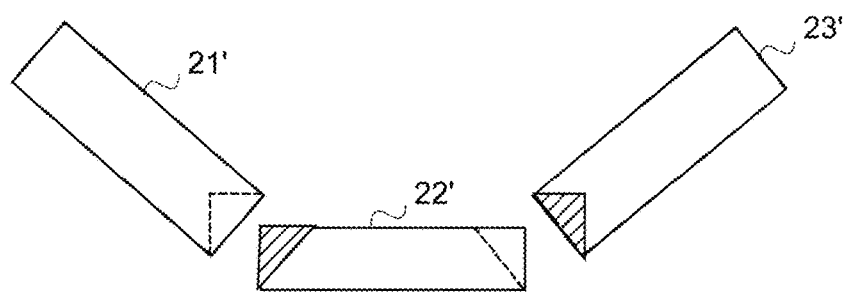
FIG. 2F illustrates an exploded top view of the basic objects forming the pseudo union for the exemplary model of FIG. 2A.
Figure 2D:
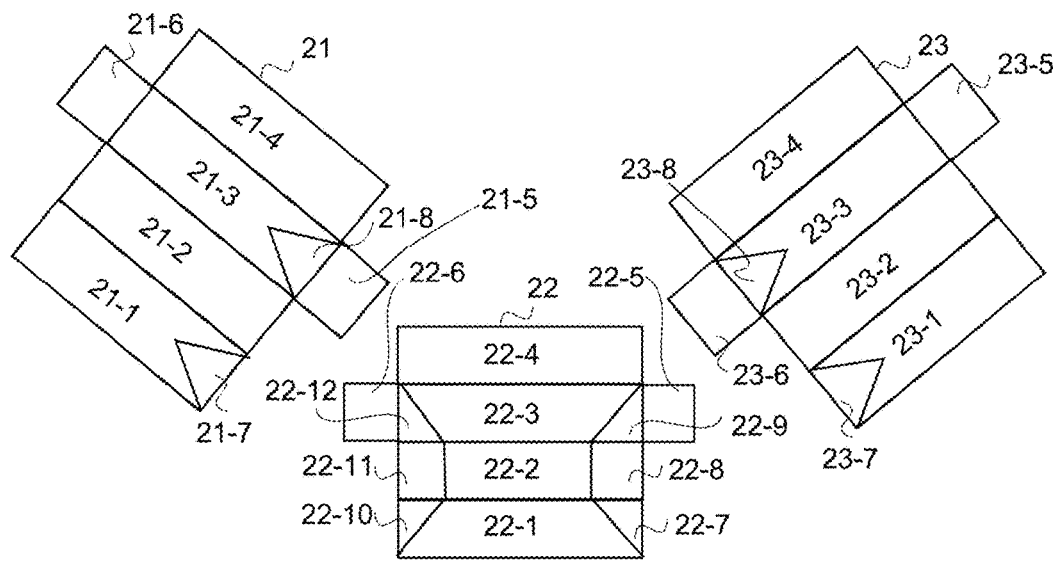
Figure 2E:
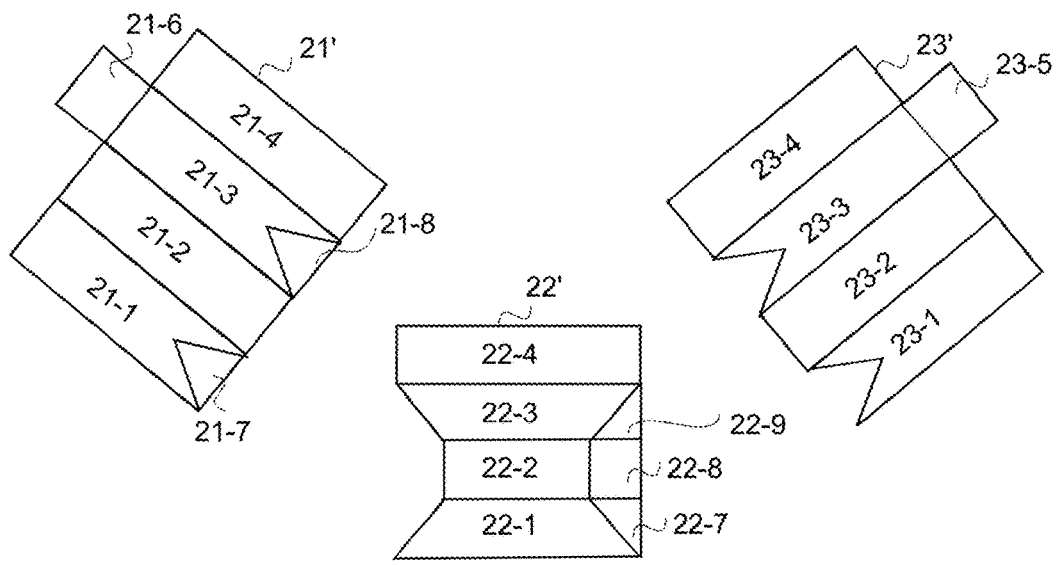

However, since only pseudo unions are formed, views of FIGS. 2B to 2H illustrate the internal structure of the structure 2 during the processing, which are not shown to the user. In other words, they illustrate how the modeling application "sees" the structure, or part of it. The exemplary content of the run-time memory described above depicts a part of a result obtained by processing the single structure 2. The model of the single structure comprises three basic objects 21, 22, 23, upper sides of which are illustrated in FIG. 2B. Different surfaces 21-1, 21-2, 21-3, 21-4, 21-5, 21-6, 22-1, 22-2, 22-3, 22-4, 22-5, 22-6, 23-1, 23-2, 23-3, 23-4, 23-5, 23-6 of each basic object 21, 22, 23 are illustrated in FIG. 2C, as if the 3D objects would have been unfolded, the surface boundaries being illustrated by unbroken lines. FIGS. 2D and 2E are corresponding "opened" drawings of the surfaces of the basic objects 21, 22, 23 after the basic objects are clipped, i.e. processed as will be described in more detail below, FIG. 2D illustrating different surfaces 21-1', 21-2, 21-3', 21-4, 21-5, 21-6, 21-7, 21-8, 22-1', 22-2', 22-3', 22-4, 22-5, 22-6, 22-7, 22-8, 22-9, 22-10, 22-11, 22-12, 23-1', 23-2, 23-3', 23-4, 23-5, 23-6, 23-7, 23-8 clipped, and FIG. 2E illustrating the surfaces 21-1', 21-2, 21-3', 21-4, 21-6, 21-7, 21-8, 22-1', 22-2', 22-3', 22-4, 22-7, 22-8, 22-9, 23-1', 23-2, 23-3', 23-4, 23-5, classified as belonging to the pseudo union, when the classification started from the basic object 21 and the last classified was the basic object 23. FIG. 2F illustrates an exploded top view of the basic objects forming the pseudo union for the exemplary model of FIG. 2A after the clipping and classification. The hatched portion of the basic objects 22' and 23' depict surfaces indicated as clipped, i.e. surfaces that will be ignored when the structure is visualized and when area or volume calculations are performed. ("Ignore" means that they are not taken into account). The dashed line in the basic objects 21' and 22' illustrates a "clipping line" between surfaces on a face, the surfaces being classified to belong to the pseudo union. As can be seen, the basic objects remain separate parts with their original size, shape, surface structure, etc., but after clipping and classifying, the separate clipped and classified topological items of the basic objects form a pseudo union of the basic objects for the processing, like visualization and volume or area calculations seen by the user as the single structure 2A. It should be appreciated that should the classifying and/or clipping start from basic object 22 or from basic object 23, some of the topological items shown (i.e. belonging to the pseudo union) would be different from those illustrated in FIGS. 2E and 2F but the end result, i.e. the pseudo union illustrated in FIG. 2A, would be the same.

Should the internal structure correspond to the single structure in FIG. 2A, it would be a real union of the basic objects, causing the original basic objects to disappear. In other words, in a pseudo union a connection between the basic objects used to model the structure and the resulting pseudo union is maintained, since the pseudo union is a collection of separate topological items of the basic objects that are not merged together and hence do not form a solid. In a real union, the connection is lost since different topological items forming the solid are merged together. The fact that the pseudo union is formed using clipping results associated with corresponding basic objects speeds up editing, for example, as will be described below.

In the following, the invention will be described by using the principles described in a book "An Introduction to Solid Modeling," by Martti Mäntylä, Computer Science Press, College Park, Md., 1988, Chapter 15, "Boolean Set Operations", pages 263 to 298, incorporated by reference herein, without restricting the invention to polyhedral objects and two solids at a time illustrated therein. There are no restrictions concerning the geometry of the model, and no restrictions relating to the modeling system used for creating the model, it suffices that the boundary representation is supported. For the sake of convenience, parts of the book which are essential for understanding the invention are repeated herein. Below, the book is called the Mäntylä book. Further, herein the term "clip" means virtual dividing of a topological item, like a face, into two or more sub-items, like faces. The virtual dividing means that the topological item remains unchanged and existing but some parts (clipped fragments) of the item may be ignored (or become invisible), as described with the above description of FIGS. 2A to 2F.

Figure 3:
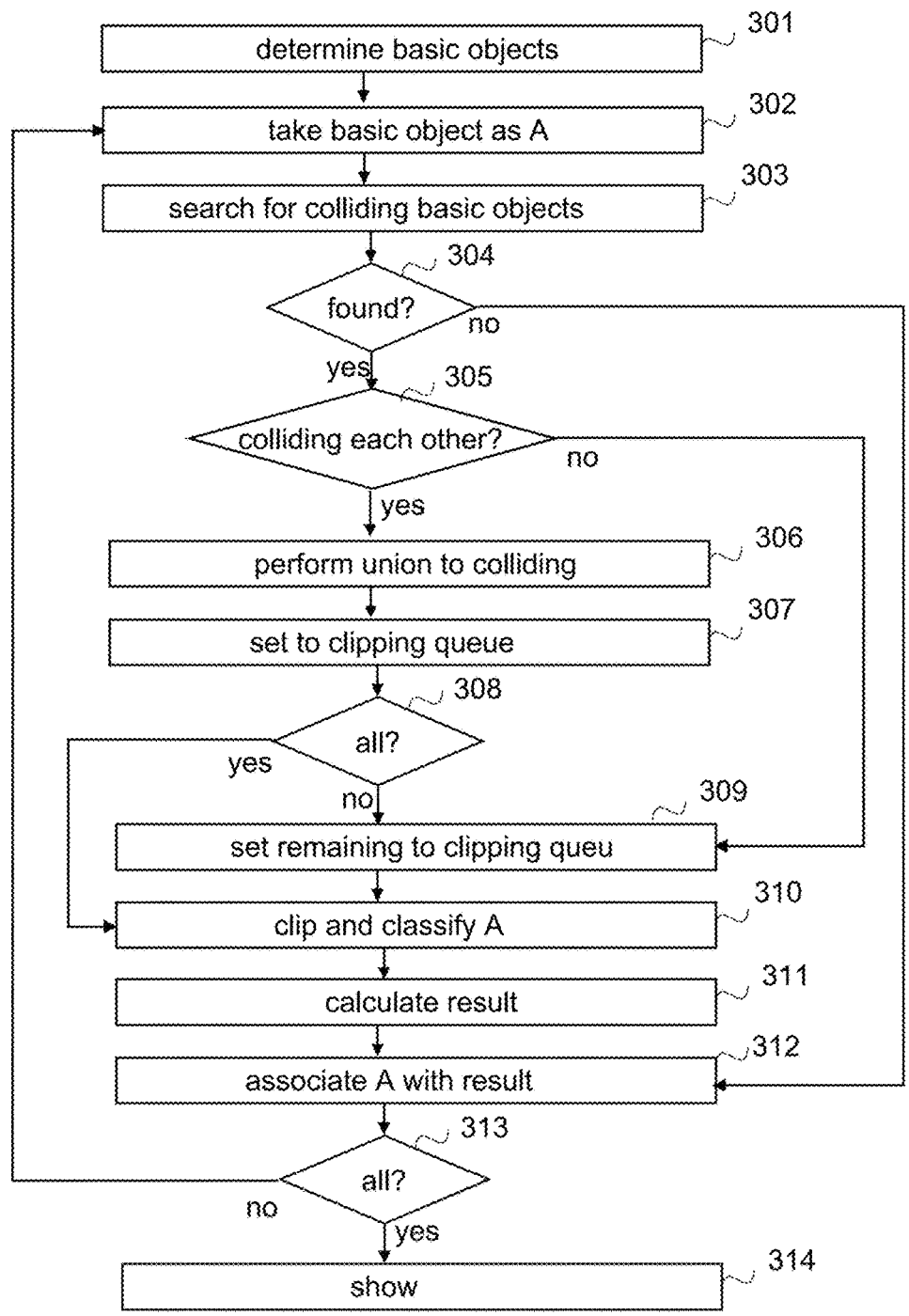
FIG. 3 is a flow chart illustrating an example of a clipping functionality.

FIG. 3 is a flow chart illustrating an exemplary background run of the clipping operation (clipping function) when a model or part of the model, like the one illustrated in FIG. 2B (i.e. a structure comprising the basic objects 21, 22 and 23), is selected first time after the model with the basic objects is read into the run-time database. It should be appreciated that the background run may be performed when the whole model is read into the run-time database, or when the structure is viewed or taken to be edited or when volume or area calculations are triggered.

In step 301, the basic objects of the structure are determined. For example, for the structure 2 illustrated in FIG. 2A, the basic objects 21, 22 and 23 illustrated in FIG. 2B are determined.

Then in step 302 a basic object is taken to be processed as part A (denotation A in the Mäntylä book), and colliding basic objects are searched for in step 303 amongst the objects defined in step 301. A colliding object means an object intersecting with or touching part A. For example, if the basic object 21 in FIG. 2B is part A, a colliding object is the basic object 22, or if the basic object 22 in FIG. 2B is part A, the colliding objects are the basic objects 21 and 23. The search for colliding objects is facilitated if the modeling application used for modeling the structure creates, during modeling or while reading in data, a hierarchy tree since the hierarchy tree may also be used for searching colliding objects. However, as said above, the hierarchy tree is an optional feature.

If one or more colliding objects are found (step 304), it is checked in step 305 whether or not within the colliding objects are objects that are also colliding with one or more other colliding objects found. If such colliding objects exist, those colliding with each other undergo a Boolean algorithm UNION in step 306, and each result is set into a clipping queue in step 307. In other words, the Boolean algorithm UNION is performed on those basic objects that are found during the search in step 303 and which collide with each other. Then it is checked in step 308 whether all colliding objects found have undergone the Boolean algorithm UNION or whether basic objects exits that only collide with part A. If yes, they are set in step 309 into the clipping queue. If none of the colliding objects found collide with another colliding object found (step 305), the colliding objects found are set in step 309 into the clipping queue.

Then, or if all colliding objects found have undergone the Boolean algorithm UNION (step 308), part A is clipped and classified in step 310 by using each union and the basic object in the clipping queue. Firstly, part A is divided into topological items, i.e. into vertices, edges (boundaries), and faces (bounded surfaces), like the faces 22-1 to 22-6 of the object 22 illustrated in FIG. 2C, the topological items being further clipped into smaller items by the union(s) and the basic object(s) in the clipping queue. For example, in FIG. 2D, faces 21-1' to 21-8 of the basic object 21 after being clipped by the basic object 22, faces 22-1' to 22-12 of the basic object 22 after being clipped by the basic objects 21 and 23, and faces 23-1' to 23-8 of the basic object 23 after being clipped by the basic object 22 are illustrated. During this time the different clipped items are provided with identifiers. Although there are no restrictions to the type of identifiers to be used, they should follow a specific order so that the order remains the same and consistency is maintained. Examples of the specific order include a creation order, and a combination of an object type (slab, column, beam, wall) and the creation order within the object type.

Then the clipped items are classified using the following classification:

AoutB means parts of A that are not overlapping/colliding with B,

AinB means parts of A that are inside B

AonB means geometrically overlapping topological faces.

For example, using the denotation of FIG. 2D, the faces 22-1', 22-2', 22-3', and 22-4 are classified as AoutB, faces 22-5, 22-6, 22-8, and 22-11 are classified as AinB, and faces 22-7, 22-9, 22-10, and 22-12 are classified as AonB.

In other words, the collected subset of basic objects are made to undergo phases called "setopgenerate" and "setopclassify" in the Mäntylä book.

Then, a result is calculated in step 311 by combining null edges created in previous steps, as is described in a phase called "setopconnect" in the Mäntylä algorithm, and by performing a finishing phase, the finishing operation deviating from the one disclosed in the Mäntylä book. In the finishing phase, "out" surfaces of A are denoted as belonging to the result, "in" surfaces are indicated as "clipped", i.e. not belonging to the result, and the surfaces classified as AonB are denoted either to belong to the result or "clipped". By classifying the overlapping faces so that only one of them, the one having the smallest identifier, for example, is selected to be part of the result, visualization of the result and calculation of volume or area can be performed by simply adding "out" faces once to a commonly known solid volume or area calculation. Alternatively, the overlapping (common) faces can be merged into one face by the Boolean algorithm UNION. The criteria for selecting which one of the two or more "on" surfaces, i.e. the overlapping surfaces, is selected to be classified to belong to the result may be based on the order of identifiers and/or surface finish, for example. An advantage provided by simply selecting one face is that no numerical computation needs be performed.

Then part A, i.e. the corresponding basic object, is associated in step 312 with the calculated result, the association being maintained as long as the calculated result is cached during the "run-time" processing.

In other words, a new procedure, called herein DoClipping, is performed. A pseudo code 401 of the procedure DoClipping is illustrated in FIG. 4 in parts 4-1 and 4-2, the other parts of the pseudo code 401 corresponding to "Program 15.15, Generation of the result" in the Mäntylä book. In the pseudo code, different parts, i.e. topological items, have been classified before they undergo the procedure according to the pseudo code.

As can be seen in the pseudo code 401, in part 4-1 only faces belonging to part A are processed instead of processing faces belonging to part A and part B, hence reducing the processing load. Further, in part 4-2, instead of combining faces and gluing of edges and vertices, those faces of part A that were not moved to the result are marked as "clipped". In other words, the result is not a single object, but a collection of separate objects (object fragments) which may be merged later, if needed.

Returning to FIG. 3, it is checked in step 313 whether all basic objects are processed as part A. If not, the process continues to step 302 where an unprocessed basic object is taken to be part A. If all basic objects are processed, the surfaces that are indicated as not clipped, for example, the ones associated with "res" in FIG. 1, are shown in step 314. For the structure 2, the result is as shown in FIG. 2F as the non-hatched area, the result comprising an object 21', an object 22', and an object 23'. The object 21' is the basic object 21 except that an end face inside basic object 22 is clipped, the object 22' is the basic object 22 except that one end is clipped by the basic object 21 and that the one of end faces inside basic object 23 is clipped, and the object 23' is the basic object 23 except that one end is clipped by the basic object 22. However, although the objects 21', 22', and 23' do not form a single solid, since the faces did not undergo combining and merging, i.e. the Boolean operation UNION, they form continuous faces usable for visualization and different volume or area calculations. In other words, for visualization and editing the structure 2 it is enough to form clipped and classified basic objects 21', 22', and 23' that form a pseudo union, and no need exists to form a single solid (real union) from the basic objects 21', 22' and 23'. Further, there is no need to define volumes of the basic objects and volumes of the parts clipped from the basic objects for visualization and for different volume or area calculations, and less processing capacity of the apparatus is required. Additionally, since faces inside another object are clipped, i.e. not shown, in the pseudo union, there is no need to perform hidden-line elimination and/or hidden-surface elimination so as not to display unseen portions. This also saves processing capacity.

If no colliding objects are found (step 304), the basic object is associated in step 311 as belonging to the result, so that it will be shown when the result is shown.

In another example, when colliding objects are found during the search in step 304, they all undergo the Boolean algorithm UNION in step 306, resulting in one part by which part A is clipped and classified in step 310. In the example, step 305 and steps 307 to 309 are skipped over.

In a further example, none of the colliding objects found during the search in step 304 undergoes the Boolean algorithm UNION but they are set into the clipping queue in step 309 and used as separate basic objects to clip and classify part A in step 310. In the example, steps 305 to 308 are skipped over.

An advantage provided by searching for colliding basic objects and clipping only using them is that this requires fewer calculations and hence uses less processing capacity of the apparatus and speeds up the processing. In other words, instead of forming object by object a single solid, i.e. processing the objects in a serial way (processing two objects at a time; one of which will end up to be the single solid and the other will be "glued" to the one) and gluing them to a real union, as is performed in the Mäntylä book, each object is processed separately (as object A) and each object remains a separate object. Hence, parallel processing may be performed. Another object provided by the separate processing is that if there is a mistake (or something is wrong), the mistake remains local, i.e. it does not affect processing of other objects, whereas in the Mäntylä book a mistake affects the whole resulting solid.

Further, the Mäntylä book teaches that when a solid is formed, the information on the solid is stored and the information on basic objects that was used to form the solid is deleted (i.e. not stored), whereas in the illustrated example, the information on basic objects is maintained and stored. This facilitates editing the model, as will be described in more detail in connection with FIG. 5.

Figure 5:
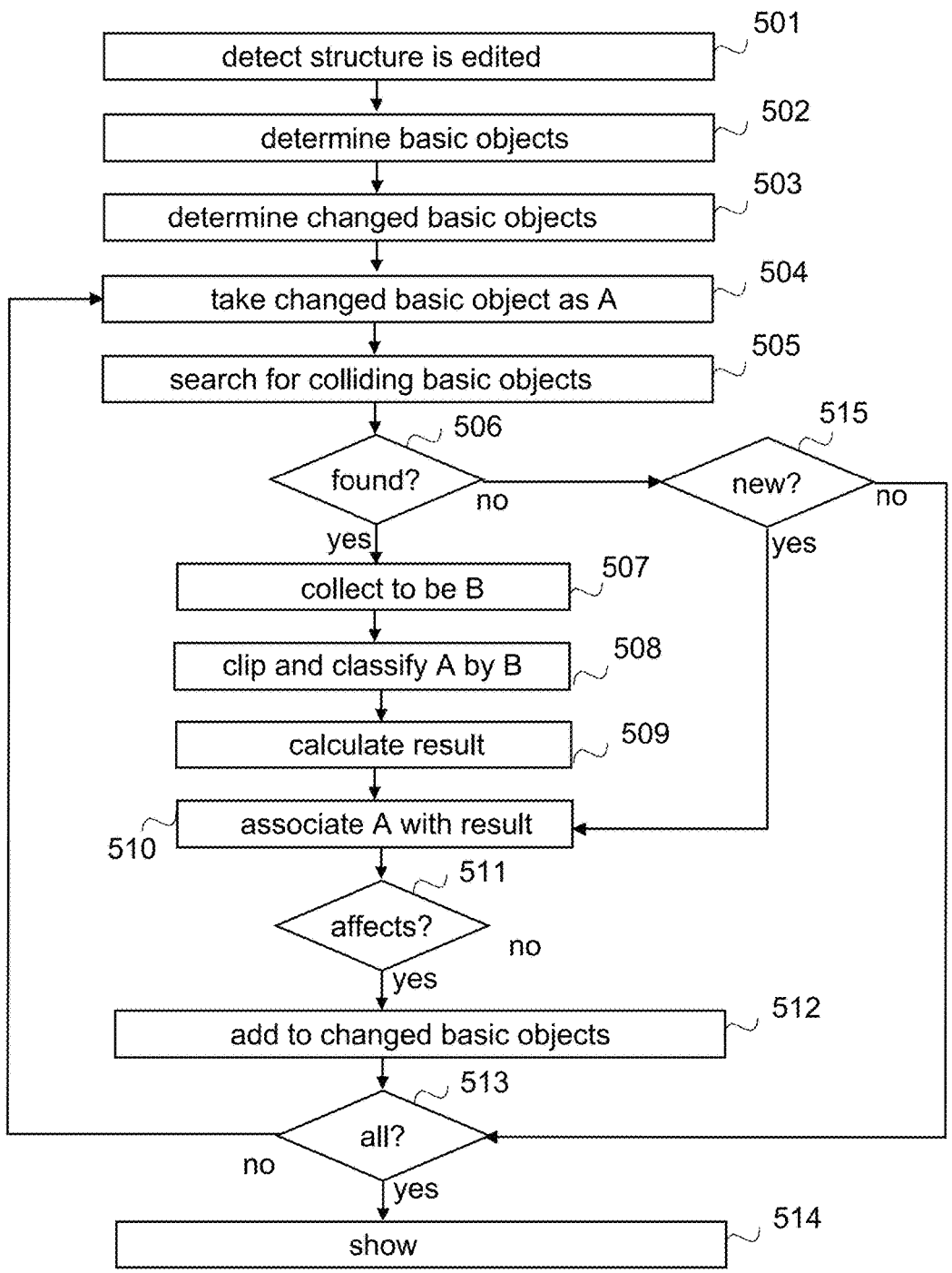
FIG. 5 is a flow chart illustrating an example of clipping during editing.

FIG. 5 is a flow chart illustrating an exemplary process when it is detected that the model is edited, i.e. one or more objects are modified or one or more new objects added.

When it is detected that a structure, like the structure 2 illustrated in FIG. 2A, or some part of the structure, is edited (step 501), i.e. modified or a new object is added, basic objects of the edited structure (including a possible added new basic object) are determined in step 502, amongst which one or more basic objects that are changed are determined in step 503. Then a changed basic object is taken in step 504 as part A, and colliding basic objects are searched for in step 505, the colliding basic objects searched for including both basic objects colliding prior to the editing and basic objects colliding after the editing. By searching colliding objects before editing and after editing it is ensured that no basic object any longer colliding with another basic object that was shortened or removed, for example, is found because its clipping and classifying has to be updated. Then, in steps 506 to 510, the same process as that described above with steps 304 to 312 is performed, the steps 305 to 309 being combined into step 507.

After the changed basic object has been processed as part A, it is checked, in step 511, whether or not the changed basic object affects the colliding objects found that have not yet been processed as part A. If yes, the affected basic objects are in step 512 added to the changed basic objects lists. Then it is checked in step 513 whether or not all changed basic objects are processed as part A. If not, the process proceeds to step 504 to take edited changed basic object as part A.

If all changed basic objects are processed (step 513), the faces that are indicated as not clipped, for example, the ones associated with "res" in FIG. 1, are shown in step 514, corresponding to step 310.

If the changed basic object does not affect the colliding objects found that have not yet been processed as part A (step 511), the process continues directly to step 513 to check whether or not all changed basic objects are processed as part A.

If no colliding objects are found (step 506), it is checked in step 515 whether or not the basic object is a new one, and if it is, the basic object is associated in step 510 as belonging to the result, so that it will be shown when the result is shown. Then the process proceeds to step 513 to check whether all changed basic objects are processed.

If in step 515 it is detected that the basic object is not a new one, the process continues to step 513 to check whether all changed basic objects are processed.

As is evident from the above, only the basic objects that are affected by the editing are processed, i.e. undergo the clipping and classifying. Hence, the process requires less calculation resources than the solution in the Mäntylä book. Further, in the solution in the Mäntylä book, since there is no information on original objects used for creating the single solid after the solid has been created, one may even have to explode the solid for editing, or delete solids and recalculate them.

Figure 6A:
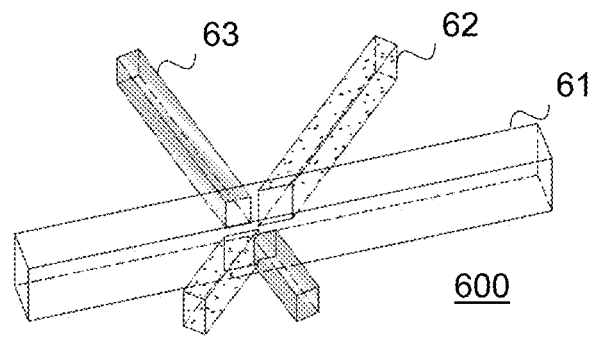
FIG. 6A illustrates another exemplary model.
Figure 6B:
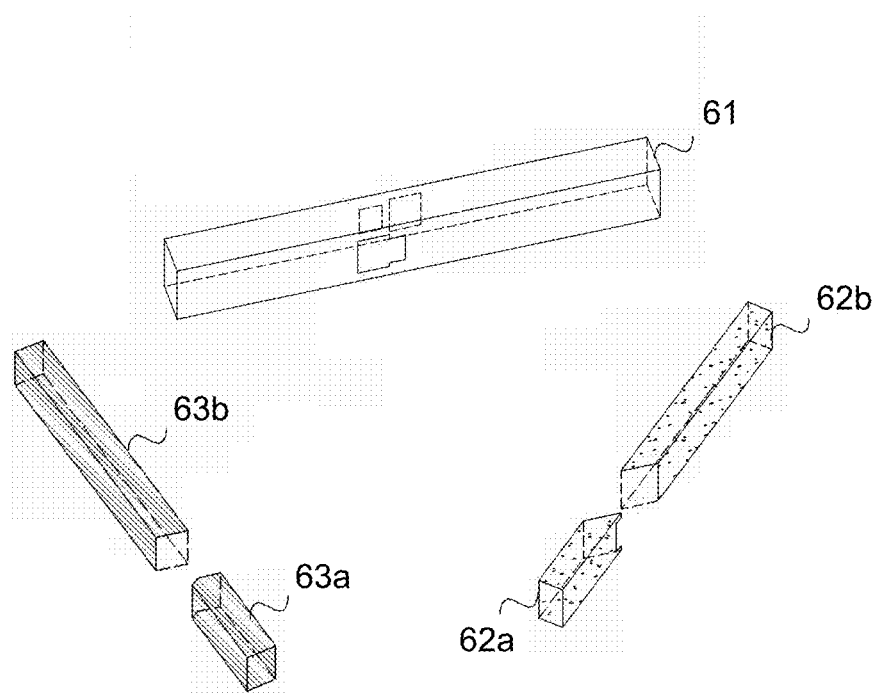
FIG. 6B is an exploded view of the clipped basic objects of the exemplary model illustrated in FIG. 6A.

FIG. 6A illustrates a three-dimensional view of another exemplary model 600 after it has undergone the clipping procedure. In other words, it illustrates a pseudo union. The model 600 comprises three basic objects that have different surface finishing, illustrated by a result 61 being white, a result 62 having dots, and a result 63 having stripes, the basic objects colliding with each other. FIG. 6B is an exploded view of the results illustrated in FIG. 6A. In other words, it shows those parts that are indicated as not clipped (i.e. belonging to the result). As can be seen, the result 61 has holes on two of its sides, and the results 62 and 63 look like they comprise two separate parts 62a, 62b, 63a, and 63b, respectively although in each case the corresponding basic object remains as it is. The results form the structure 600 while maintaining different surface finishing and being separate results, each associated with a corresponding separate basic object. It is evident, than if a further object, touching only one of the basic objects illustrated in Figure, is added, it is sufficient to update clipping of the further object and the touched basic objects. Should the results be merged, as the prior art teaches, all part should be updated, and hence more computational capacity would be used.

The steps shown in FIGS. 3 and 5 are in no absolute chronological order, and some of the steps may be performed simultaneously or in an order different from the given one, and steps in one Figure may be performed simultaneously or overlapping with steps in another Figure. Other functions can also be executed between the steps or within the steps. For example in step 302, instead of taking one basic object, several basic objects can be selected to be part A, using for example the principles described in the above-cited publication "Boolean operations on multi-region solids for mesh generation", which is incorporated herein by reference. Another example of a further step is storing the clipping and classifying results from the cache to be part of the model, as well. Some of the steps or part of the steps can also be left out. The steps in different Figures can also be freely combined or divided into several parts.

It will be obvious to a person skilled in the art that as technology advances, the inventive concept can be implemented in various ways. The invention and its embodiments are not limited to the examples described above but may vary within the scope of the claims.

What is claimed is:

1. A computerized method for displaying a model, the method comprising:
   providing, by a modeling application, a first object and a second object, wherein the first and second objects are to be used to model a structure comprising the first and second objects;
   dividing, by the modeling application, the first object into a first set of topological items and the second object into a second set of topological items, wherein each topological item represents a boundary of one of the first and second objects, and wherein the first set of topological items defines a first three-dimensional structure having a first set of boundaries defined by the first set of topological items and the second set of topological items defines a second three-dimensional structure having a second set of boundaries defined by the second set of topological items;
   determining, by the modeling application, that at least one topological item of the first set of topological items is positioned inside of the second three-dimensional structure defined by the second set of topological items;
   determining, by the modeling application, that at least one topological item of the first set of topological items overlaps a topological item of the second set of topological items;
   determining, by the modeling application, that at least one topological item of the first set of topological items is positioned outside of the second three-dimensional structure;
   indicating, by the modeling application, the at least one topological item positioned inside of the second three-dimensional structure and the at least one topological item overlapping a topological item of the second three-dimensional structure as clipped and the at least one topological item positioned outside of the second three-dimensional structure as not clipped;
   generating, by the modeling application, a model of the structure comprising the first and second objects by using the topological items indicated as not clipped and ignoring the topological items indicated as clipped for visualization or for calculation of the volume or the area of the model, while the first and second objects remain separate objects but are visualized as a single structure having a volume and an area without merging the topological items, wherein the topological items indicated as clipped are topological items that intersect one of the first and second objects; and
   displaying, by the modeling application, the model of the structure having a three-dimensional shape that uses the topological items indicated as not clipped and ignores the topological items indicated as clipped for visualization or for calculation of the volume or the area of the model.

2. A computerized method as claimed in claim 1, wherein the providing comprises:
   classifying, by the modeling application, the first and second sets of topological items so that a topological item not overlapping or colliding with a topological entity of another object is classified as out, a topological item inside another object is classified as in, and a topological item overlapping a topological item of another object is classified as on;
   performing, by the modeling application, a clipping operation by using Boolean operators on the first and second sets of topological items, an outcome of the clipping operation being that topological items other than those classified as out, and if the topological items comprises faces classified as on, other than one of faces geometrically overlapping each other, are indicated as clipped ones; and
   associating, by the modeling application, each topological item with information indicating whether it is indicated as clipped or not clipped.

3. A computerized method as claimed in claim 2, further comprising performing, by the modeling application, the following on each object modeling the structure:
   searching for colliding objects;
   using the colliding objects when topological items of an object are determined;
   performing the classifying, clipping operation and associating on the topological items of the object; and associating the object with information on topological items.

4. A computerized method as claimed in claim 3, further comprising, in response to detecting, by the modeling application, a change of at least one of the objects, performing, by the modeling application, the following on each changed object:
  a) searching for objects that collided with the changed object before the change;
  b) searching for objects that will collide with the changed object after the change;
  c) performing the classifying, clipping operation and associating on the topological items of the changed object by using the objects that collided or will collide with the changed object;
  d) checking whether or not the change affects the objects that collided or will collide;
  e) determining each object affected to be a changed object; and
  f) repeating a) to e) for each changed object.

5. A computerized method for displaying a model, the method comprising:
  retrieving, by a modeling application, from memory data boundary representations of a first object and a second object used to model a structure comprising the first and second objects;
  dividing, by the modeling application, the first object into a first set of topological items and the second object into a second set of topological items, wherein each topological item represents a boundary of one of the first and second objects, and wherein the first set of topological items defines a first three-dimensional structure having a first set of boundaries defined by the first set of topological items and the second set of topological items defines a second three-dimensional structure having a second set of boundaries defined by the second set of topological items;
  determining, by the modeling application, that at least one topological item of the first set of topological items is positioned inside of the second three-dimensional structure defined by the second set of topological items;
  determining, by the modeling application, that at least one topological item of the first set of topological items overlaps a topological item of the second set of topological items;
  determining, by the modeling application, that at least one topological item of the first set of topological items is positioned outside of the second three-dimensional structure;
  classifying, by the modeling application, the first and second sets of topological items so that the at least one topological item of the first set of topological items of the first set of topological items that is positioned outside of the second three-dimensional structure is classified as out, the at least one topological item of the first set of topological items that is positioned inside of the second three-dimensional structure is classified as in, and the at least one topological item of the first set of topological items that overlaps a topological item of the second set of topological items is classified as on;
  performing, by the modeling application, a clipping operation using Boolean operators to the first and second sets of topological items, the clipping operation resulting in an identification of at least one topological item of the first set of topological items is positioned within the second set of boundaries of the second three-dimensional structure defined by the second set of topological item;
  associating, by the modeling application, each topological item with information indicating whether it is indicated as clipped or not clipped, wherein the topological items indicated as clipped include the at least one topological item;
  in response to detecting a request to visualize a model for the structure, using, by the modeling application, the first and second sets of topological items and associated information so that topological items indicated as not clipped are outputted via a user interface to visualize the model and topological items indicated as clipped are ignored, while the first and second objects remain separate objects but are visualized as a single structure having a volume and an area without merging the topological items, wherein the at least one topological item indicated as clipped are topological items that intersect one of the first and second objects;
  in response to detecting triggering of volume or area calculations including the structure, using, by the modeling application, the topological items and associated information so that topological items indicated as not clipped are used for defining the volume or area and topological items indicated as clipped are ignored;
  in response to detecting, by the modeling application, a change of at least one of the objects, performing, by the modeling application, the following on each changed object:
    a) searching for objects that collided with the changed object before the change;
    b) searching for objects that will collide with the changed object after the change;
    c) performing the classifying, clipping operation and associating on the topological items of the changed object by using the objects that collided or will collide with the changed object;
    d) checking whether or not the change affects the objects that collided or will collide;
    e) determining each object affected to be a changed object; and
    f) repeating a) to e) for each changed object; and
  displaying, by the modeling application, the model of the structure having a three-dimensional shape that uses the topological items indicated as not clipped and ignores the topological items indicated as clipped for visualization or for calculation of the volume or the area of the model.

6. An apparatus for displaying a model, the apparatus comprising
  at least one processor; and
  at least one memory including computer program code;
  the at least one memory and the computer program code being configured to, with the at least one processor, cause the apparatus at least to:
    provide, by a modeling application, a first object and a second object, wherein the first and second objects are to be used to model a structure comprising the first and second objects;
    divide, by a modeling application, the first object into a first set of topological items and the second object into a second set of topological items, wherein each topological item represents a boundary of one of the first and second objects, and wherein the first set of topological items defines a first three-dimensional structure having a first set of boundaries defined by the first set of topological items and the second set of topological items defines a second three-dimensional structure having a second set of boundaries defined by the second set of topological items;

determine, by the modeling application, that at least one topological item of the first set of topological items is positioned inside of the second three-dimensional structure defined by the second set of topological items;

determine, by the modeling application, that at least one topological item of the first set of topological items overlaps a topological item of the second set of topological items;

determine, by the modeling application, that at least one topological item of the first set of topological items is positioned outside of the second three-dimensional structure;

indicate, by the modeling application, the at least one topological item positioned inside of the second three-dimensional structure and the at least one topological item overlapping a topological item of the second three-dimensional structure as clipped and the at least one topological item positioned outside of the second three-dimensional structure as not clipped;

generate, by the modeling application, a model of the structure comprising the first and second objects by using the topological items indicated as not clipped and ignoring the topological items indicated as clipped for visualization or for calculation of the volume or the area of the model, while the first and second objects remain separate objects but are visualized as a single structure having a volume and an area without merging the topological items, wherein the topological items indicated as clipped are topological items that intersect one of the first and second objects; and display, by the modeling application, the model of the structure having a three-dimensional shape that uses the topological items indicated as not clipped and ignores the topological items indicated as clipped for visualization or for calculation of the volume or the area of the model.

7. An apparatus as claimed in claim 6, wherein the at least one memory and the computer program code are configured to, with the at least one processor, further cause the apparatus at least to:

classify the first and second sets of topological items so that a topological item not overlapping or colliding with a topological entity of another object is classified as out, a topological item inside another object is classified as in, and a topological item overlapping a topological item of another object is classified as on;

perform a clipping operation by using Boolean operators on the first and second sets of topological items, the clipping operation resulting in an identification of at least one topological item of the first set of topological items is positioned within the second set of boundaries of the second three-dimensional structure defined by the second set of topological item; and associate each topological item with information indicating whether it is indicated as clipped or not clipped.

8. An apparatus as claimed in claim 7, wherein the at least one memory and the computer program code are configured to, with the at least one processor, further cause the apparatus at least to perform the following on each object modeling the structure:

searching for colliding objects;
using the colliding objects when topological items of an object are determined;
performing the classifying, clipping operation and associating on the topological items of the object; and
associating the object with information on topological items.

9. An apparatus as claimed in claim 7, wherein the at least one memory and the computer program code are configured to, with the at least one processor, further cause the apparatus at least to detect one or more changed object and perform the following on each changed object:

a) searching for objects that collided with the changed object before the change;
b) searching for objects that will collide with the changed object after the change;
c) performing the classifying, clipping operation and associating on the topological items of the changed object by using the objects that collided or will collide with the changed object;
d) checking whether or not the change affects the objects that collided or will collide; and
e) determining each object affected to be a changed object.

10. A computer program product embodied on a non-transitory distribution medium readable by a computer and comprising program instructions which, when executed by the computer, perform a computer process for displaying a model, the computer process comprising:

providing, by a modeling application, a first object and a second object, wherein the first and second objects are to be used to model a structure comprising the first and second objects;

dividing, by the modeling application, the first object into a first set of topological items and the second object into a second set of topological items, wherein each topological item represents a boundary of one of the first and second objects, and wherein the first set of topological items defines a first three-dimensional structure having a first set of boundaries defined by the first set of topological items and the second set of topological items defines a second three-dimensional structure having a second set of boundaries defined by the second set of topological items;

determining, by the modeling application, that at least one topological item of the first set of topological items is positioned inside of the second three-dimensional structure defined by the second set of topological items;

determining, by the modeling application, that at least one topological item of the first set of topological items overlaps a topological item of the second set of topological items;

determining, by the modeling application, that at least one topological item of the first set of topological items is positioned outside of the second three-dimensional structure;

indicating, by the modeling application, the at least one topological item positioned inside of the second three-dimensional structure and the at least one topological item overlapping a topological item of the second three-dimensional structure as clipped and the at least one topological item positioned outside of the second three-dimensional structure as not clipped;

generating, by the modeling application, a model of the structure comprising the first and second objects by using the topological items indicated as not clipped and ignoring the topological items indicated as clipped for visualization or for calculation of the volume or the area of the model, while the first and second objects remain separate objects but are visualized as a single structure having a volume and an area without merging the topological items, wherein the topological items indicated as clipped are topological items that intersect one of the first and second objects; and displaying, by the modeling application, the model of the structure having a three-dimensional shape that uses the topological items indicated as not clipped and ignores the topological items indicated as clipped for visualization or for calculation of the volume or the area of the model.

11. A computer program product as claimed in claim 10, wherein the computer process further comprises:

Classifying, by the modeling application, the first and second sets of topological items so that a topological item not overlapping or colliding with a topological entity of another object is classified as out, a topological item inside another object is classified as in, and a topological item overlapping a topological item of another object is classified as on;

performing, by the modeling application, a clipping operation by using Boolean operators on the first and second sets of topological items, the clipping operation resulting in an identification of at least one topological item of the first set of topological items is positioned within the second set of boundaries of the second three-dimensional structure defined by the second set of topological item; and associating, by the modeling application, each topological item with information indicating whether it is indicated as clipped or not clipped, wherein the topological items indicated as clipped include the at least one topological item.

12. A computer program product as claimed in claim 11, wherein the computer process further comprises performing, by the modeling application, the following on each object modeling the structure:

searching for colliding objects;
using the colliding objects when topological items of an object are determined;
performing the classifying, clipping operation and associating on the topological items of the object; and
associating the object with information on topological items.

13. A computer program product as claimed in claim 12, wherein the computer process further comprises performing, in response to detecting a change of at least one of the objects, the following on each changed object:

a) searching for objects that collided with the changed object before the change;
b) searching for objects that will collide with the changed object after the change;
c) performing the classifying, clipping operation and associating on the topological items of the changed object by using the objects that collided or will collide with the changed object;
d) checking whether or not the change affects the objects that collided or will collide;
e) determining each object affected to be a changed object; and
f) repeating a) to e) for each changed object.

14. A computer program product embodied on a non-transitory distribution medium readable by a computer and comprising program instructions which, when executed by the computer, perform a computer process for displaying a model, the computer process comprising:

retrieving, by a modeling application, from memory data boundary representations of a first object and a second object used to model a structure comprising the first and second objects;

dividing, by the modeling application, the first object into a first set of topological items and the second object into a second set of topological items, wherein each topological item represents a boundary of one of the first and second objects, and wherein the first set of topological items defines a first three-dimensional structure having a first set of boundaries defined by the first set of topological items and the second set of topological items defines a second three-dimensional structure having a second set of boundaries defined by the second set of topological items;

determining, by the modeling application, that at least one topological item of the first set of topological items is positioned inside of the second three-dimensional structure defined by the second set of topological items;

determining, by the modeling application, that at least one topological item of the first set of topological items overlaps a topological item of the second set of topological items;

determining, by the modeling application, that at least one topological item of the first set of topological items is positioned outside of the second three-dimensional structure;

classifying, by the modeling application, the first and second sets of topological items so that the at least one topological item of the first set of topological items of the first set of topological items that is positioned outside of the second three-dimensional structure is classified as out, the at least one topological item of the first set of topological items that is positioned inside of the second three-dimensional structure is classified as in, and the at least one topological item of the first set of topological items that overlaps a topological item of the second set of topological items is classified as on;

performing, by the modeling application, a clipping operation using Boolean operators to the first and second sets of topological items, the clipping operation resulting in an identification of at least one topological item of the first set of topological items is positioned within the second set of boundaries of the second three-dimensional structure defined by the second set of topological item;

associating, by the modeling application, each topological item with information indicating whether it is indicated as clipped or not clipped, wherein the topological items indicated as clipped include the at least one topological item;

in response to detecting a request to visualize a model for the structure, using, by the modeling application, the first and second sets of topological items and associated information so that topological items indicated as not clipped are outputted via a user interface to visualize the model and topological items indicated as clipped are ignored, while the first and second objects remain separate objects but are visualized as a single structure having a volume and an area without merging the topological items, wherein the at least one topological item indicated as clipped are topological items that intersect one of the first and second objects;

in response to detecting triggering of volume or area calculations including the structure, using, by the modeling application, the first and second sets of topological items and associated information so that topological items indicated as not clipped are used for defining the volume or area and topological items indicated as clipped are ignored;

in response to detecting a change of at least one of the objects, performing the following on each changed object:

a) searching for objects that collided with the changed object before the change;
b) searching for objects that will collide with the changed object after the change;
c) performing the classifying, clipping operation and associating on the topological items of the changed object by using the objects that collided or will collide with the changed object;
d) checking whether or not the change affects the objects that collided or will collide;
e) determining each object affected to be a changed object; and
f) repeating a) to e) for each changed object; and displaying, by the modeling application, the model of the structure having a three-dimensional shape that uses the topological items indicated as not clipped and ignores the topological items indicated as clipped for visualization or for calculation of the volume or the area of the model.

* * * * *